(12) United States Patent
Nakamura et al.

(10) Patent No.: US 9,385,096 B2
(45) Date of Patent: Jul. 5, 2016

(54) SEMICONDUCTOR DEVICE WITH BUMPS AND DISPLAY DEVICE MODULE INCORPORATING THE SAME

(71) Applicant: Synaptics Display Devices GK, Tokyo (JP)

(72) Inventors: Hisao Nakamura, Tokyo (JP); Yuichi Nakagomi, Tokyo (JP); Shinya Suzuki, Tokyo (JP)

(73) Assignee: SYNAPTICS DISPLAY DEVICES GK, Tokyo (JP)

( * ) Notice: Subject to any disclaimer, the term of this patent is extended or adjusted under 35 U.S.C. 154(b) by 0 days.

(21) Appl. No.: 14/276,872

(22) Filed: May 13, 2014

(65) Prior Publication Data

US 2014/0361429 A1    Dec. 11, 2014

(30) Foreign Application Priority Data

Jun. 7, 2013   (JP) .................................. 2013-121233

(51) Int. Cl.
  *H01L 23/00*     (2006.01)
  *H01L 23/498*    (2006.01)
  *H01L 23/528*    (2006.01)

(52) U.S. Cl.
  CPC ............ *H01L 24/14* (2013.01); *H01L 23/5286* (2013.01); *H01L 24/83* (2013.01); *H01L 24/91* (2013.01); *H01L 24/13* (2013.01); *H01L 24/16* (2013.01); *H01L 24/81* (2013.01); *H01L 2224/03462* (2013.01); *H01L 2224/0401* (2013.01); *H01L 2224/0558* (2013.01); *H01L 2224/05166* (2013.01); *H01L 2224/05184* (2013.01); *H01L 2224/05567* (2013.01);
  (Continued)

(58) Field of Classification Search
  CPC .... H01L 24/14; H01L 24/81; H01L 23/49811

USPC ........................................... 257/737; 438/119
See application file for complete search history.

(56) References Cited

U.S. PATENT DOCUMENTS

2008/0303968 A1* 12/2008 Terada et al. .................... 349/46
2009/0121349 A1*  5/2009 Suzuki .......................... 257/737
(Continued)

FOREIGN PATENT DOCUMENTS

JP   2007-103848 A   4/2007
JP   2011-029396 A   2/2011
WO   WO 2010/146884 A1  12/2010

*Primary Examiner* — Christine Enad
(74) *Attorney, Agent, or Firm* — McGinn IP Law Group PLLC

(57) ABSTRACT

A semiconductor device includes: a semiconductor chip having a main face which has a pair of long sides parallel to each other and a pair of short sides orthogonal to the pair of long sides; first bumps arrayed in a first bump placement region of the semiconductor chip, the first bump placement region being positioned along one of the pair of long sides; second bumps arrayed in a second bump placement region of the semiconductor chip, the second bump placement region being positioned along the other of the pair of long sides; first power lines disposed in a region between the first bump placement region and the second bump placement region, the first power lines extending in a direction parallel to the pair of long sides; and third bumps integrated on the semiconductor chip. Each of the third bumps provides short-circuiting of the first power lines.

20 Claims, 9 Drawing Sheets

(52) U.S. Cl.
CPC ............... *H01L 2224/05644* (2013.01); *H01L 2224/1134* (2013.01); *H01L 2224/13027* (2013.01); *H01L 2224/13028* (2013.01); *H01L 2224/13144* (2013.01); *H01L 2224/1403* (2013.01); *H01L 2224/14155* (2013.01); *H01L 2224/1613* (2013.01); *H01L 2224/293* (2013.01); *H01L 2224/2929* (2013.01); *H01L 2224/81139* (2013.01); *H01L 2224/81191* (2013.01); *H01L 2224/81903* (2013.01); *H01L 2224/83139* (2013.01); *H01L 2224/83192* (2013.01); *H01L 2224/83203* (2013.01); *H01L 2224/83851* (2013.01); *H01L 2224/83986* (2013.01); *H01L 2224/9211* (2013.01); *H01L 2924/12044* (2013.01); *H01L 2924/15788* (2013.01)

(56)  References Cited

U.S. PATENT DOCUMENTS

| | | | | |
|---|---|---|---|---|
| 2009/0283904 | A1* | 11/2009 | Ali et al. | 257/737 |
| 2013/0328210 | A1* | 12/2013 | Shim | H01L 23/49827 257/774 |
| 2014/0071107 | A1* | 3/2014 | Hong et al. | 345/211 |

* cited by examiner

A-A

B-B

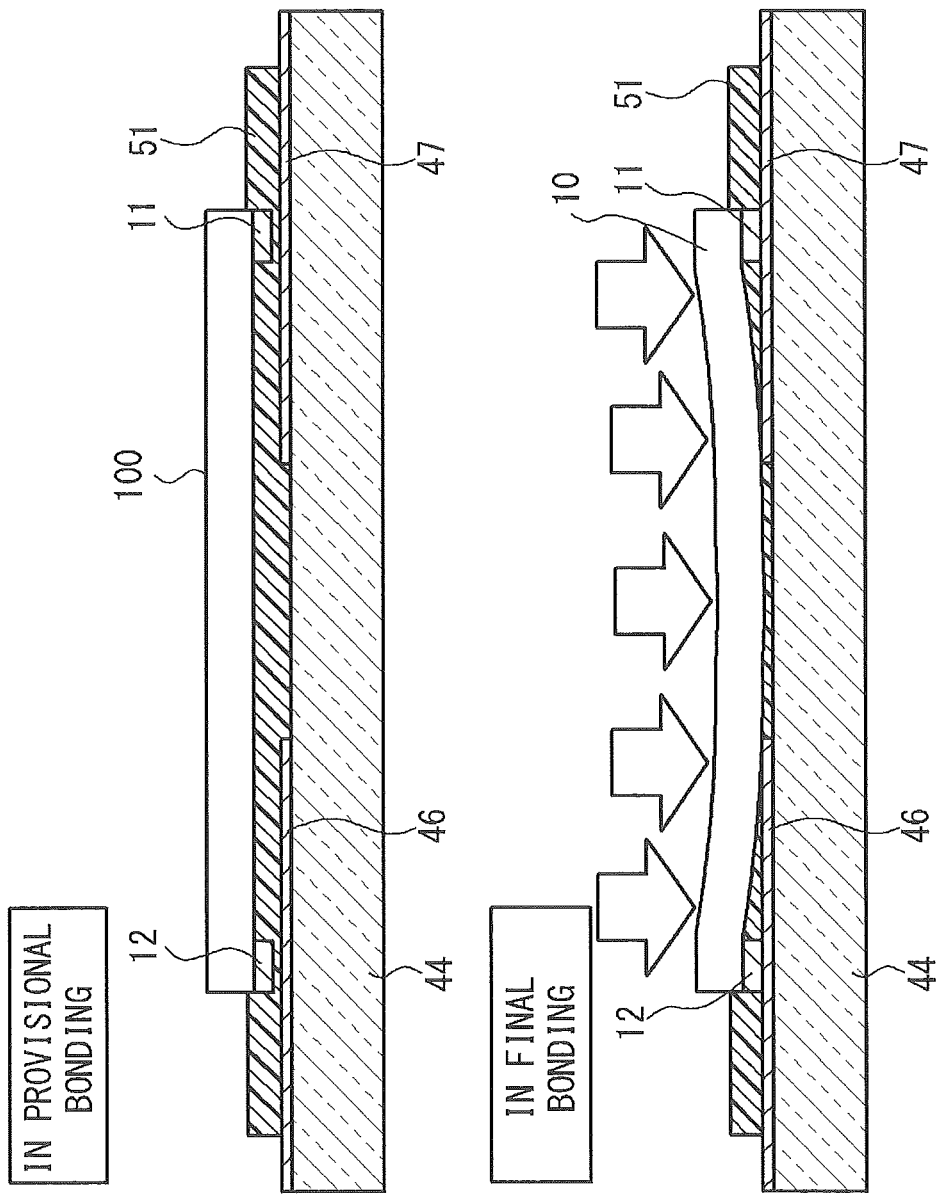

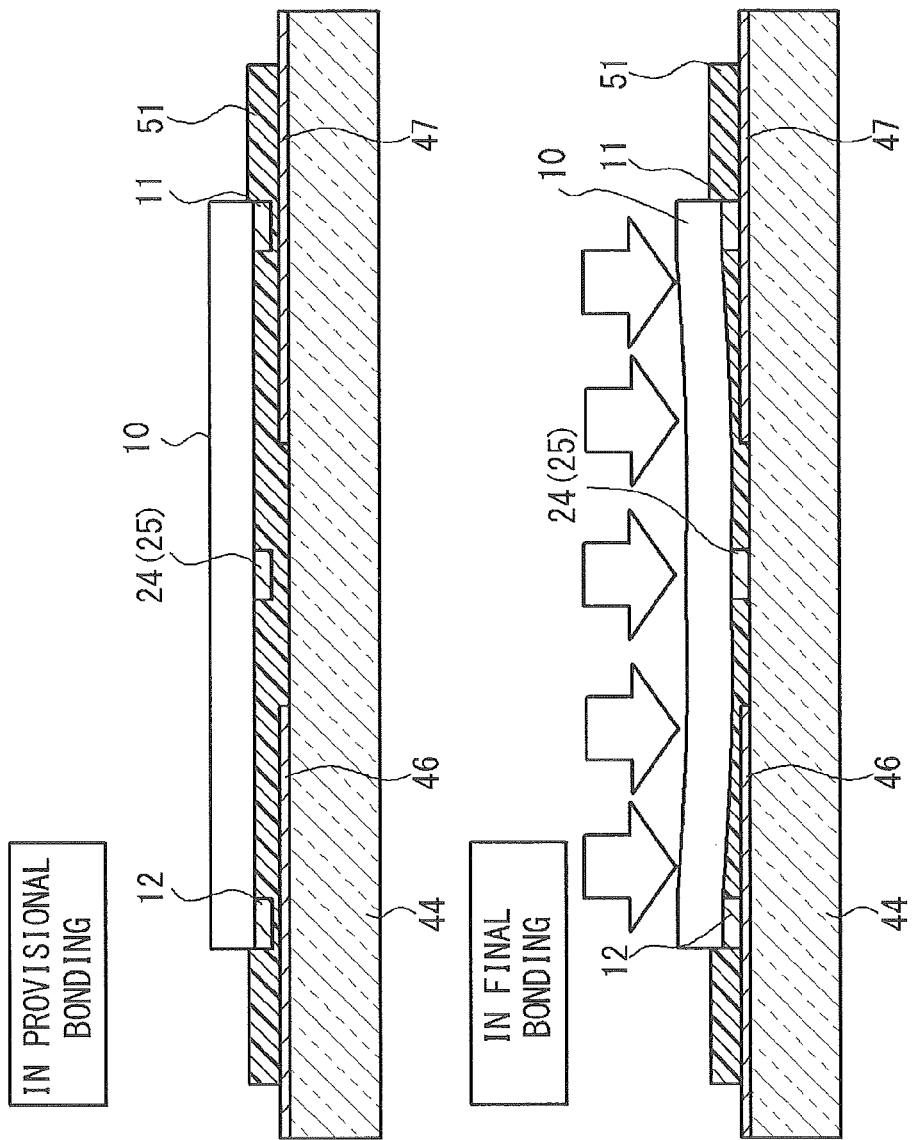

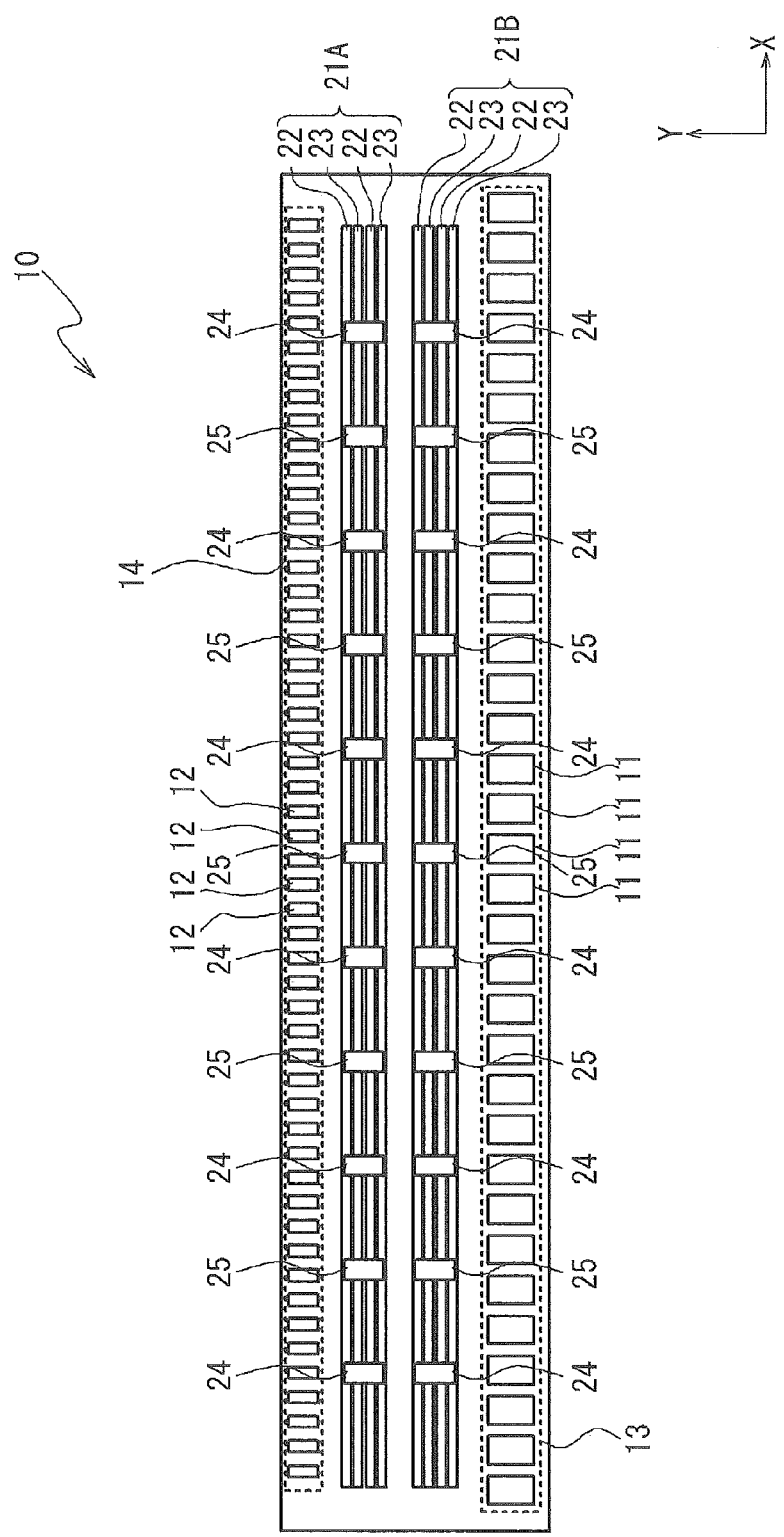

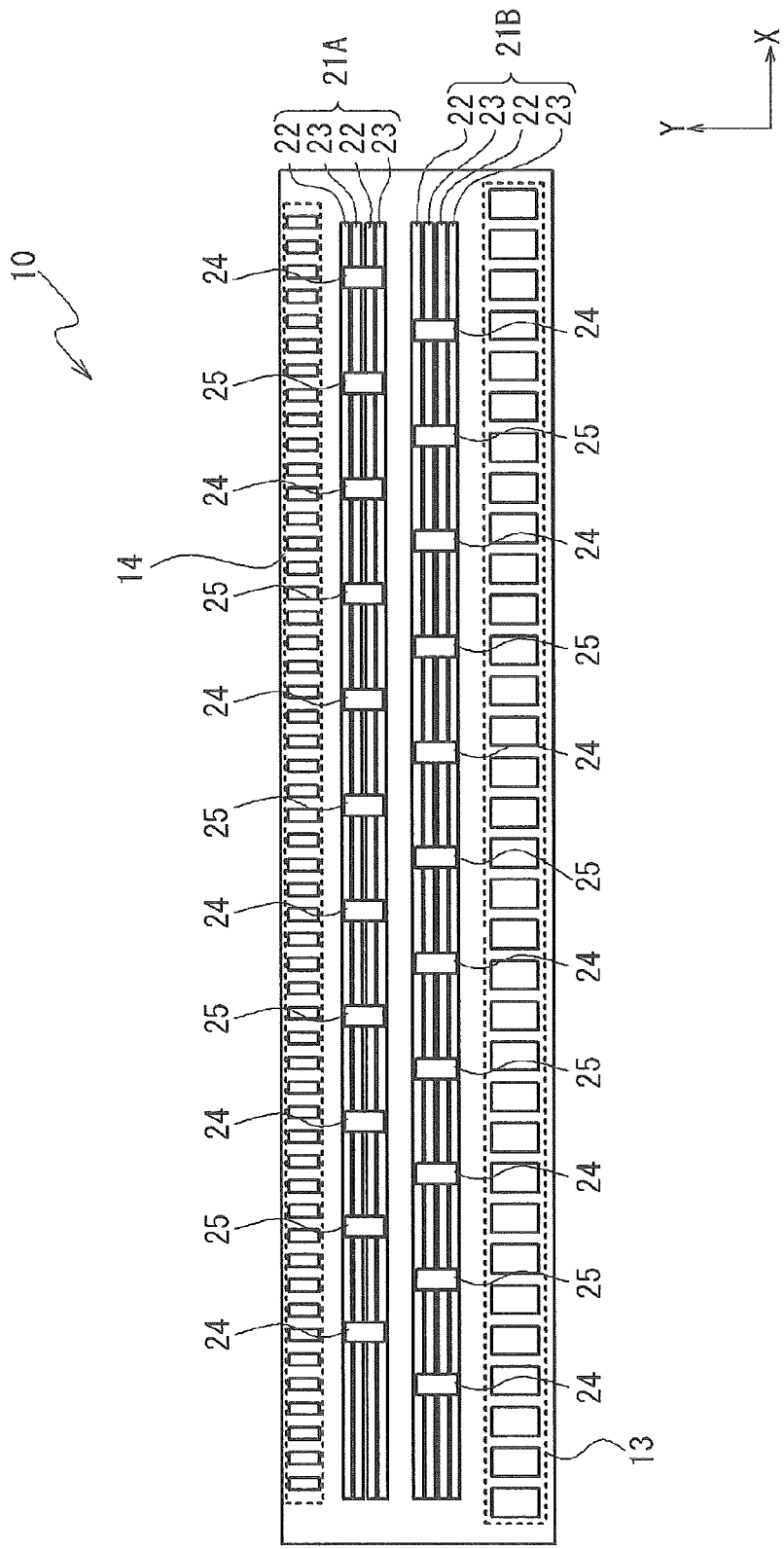

SEMICONDUCTOR DEVICE WITH BUMPS AND DISPLAY DEVICE MODULE INCORPORATING THE SAME

CROSS REFERENCE

This application claims priority of Japanese Patent Application No. Japanese Patent Application No. 2013-121233, filed on Jun. 7, 2013, the disclosure which is incorporated herein by reference.

TECHNICAL FIELD

The present invention relates to a semiconductor device, a display device module and a manufacturing method of the same, in particular, to a semiconductor device having bumps suitable for flip-chip mounting.

BACKGROUND ART

The flip-chip mounting, such as the chip-on-glass (COG) mounting, is a widely-used mounting technique used for size reduction of electronic appliances. The flip-chip mounting is a technique in which bumps are formed on a semiconductor chip and electrical connections are achieved with the bumps between circuits integrated in the semiconductor chip and interconnections formed on a circuit board. The flip-chip mounting is disclosed, for example, in the following patent documents.

Japanese Patent Application Publication No. 2007-103848 A discloses a technique in which the size of pads is reduced than that of the bump electrodes, to thereby reduce the size of the semiconductor chip.

Japanese Patent Application Publication No. 2011-29396 A discloses a semiconductor device in which a bump electrode has the function of connecting two signal interconnections.

International Publication No. WO 2010/146884 A discloses a semiconductor device in which a group of dummy bumps are provided between an array of input bumps arrayed along one long side and an array of output bumps arrayed along another long side. Here, the dummy bumps are bumps which do not have the function of providing electrical connections. In this patent document, a technique is disclosed for obtaining sufficient flows of ACF (anisotropic conductive film) resin toward the corners of the chip by blocking flows of ACF resin toward the short sides with dummy bumps, to thereby suppress connection failures resulting from an insufficient flow of ACD resin.

SUMMARY OF INVENTION

As a result of an inventors' study on a semiconductor device having bumps, the inventors have discovered that a bump can be used to reduce an effective resistance of a power line (which means an interconnection which delivers a power supply voltage or an interconnection kept at the circuit ground level, in the present application). Therefore, one objective of the present invention is to provide a technique for reducing the effective resistance of power lines.

In an aspect of the present invention, a semiconductor device includes: a semiconductor chip having a main face which has a pair of long sides parallel to each other and a pair of short sides orthogonal to the pair of long sides; first bumps arrayed in a first bump placement region of the semiconductor chip, the first bump placement region being positioned along one of the pair of long sides; second bumps arrayed in a second bump placement region of the semiconductor chip, the second bump placement region being positioned along the other of the pair of long sides; first power lines disposed in a region between the first bump placement region and the second bump placement region, the first power lines extending in a direction parallel to the pair of long sides; and third bumps integrated on the semiconductor chip. Each of the third bumps provides short-circuiting of the first power lines.

The semiconductor device thus constructed is suitable for flip-chip mounting (or COG mounting) onto a glass substrate of a display panel.

BRIEF DESCRIPTION OF THE DRAWINGS

The above and other advantages and features of the present invention will be more apparent from the following description taken in conjunction with the accompanied drawings, in which:

FIG. 8 is a schematic diagram illustrating a deformation of a semiconductor chip caused by applying a pressure to the rear face of a semiconductor chip in a COG mounting process for the case when no bumps are provided at the center portion of the semiconductor chip;

FIG. 9 is a schematic diagram illustrating a deformation of the semiconductor chip in the present embodiment caused by applying a pressure to the rear face of the semiconductor chip in a COG mounting process;

FIG. 10 is a plan view illustrating a modification of the semiconductor device in the present embodiment; and FIG. 11 is a plan view illustrating another modification of the semiconductor device in the present embodiment.

DESCRIPTION OF PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
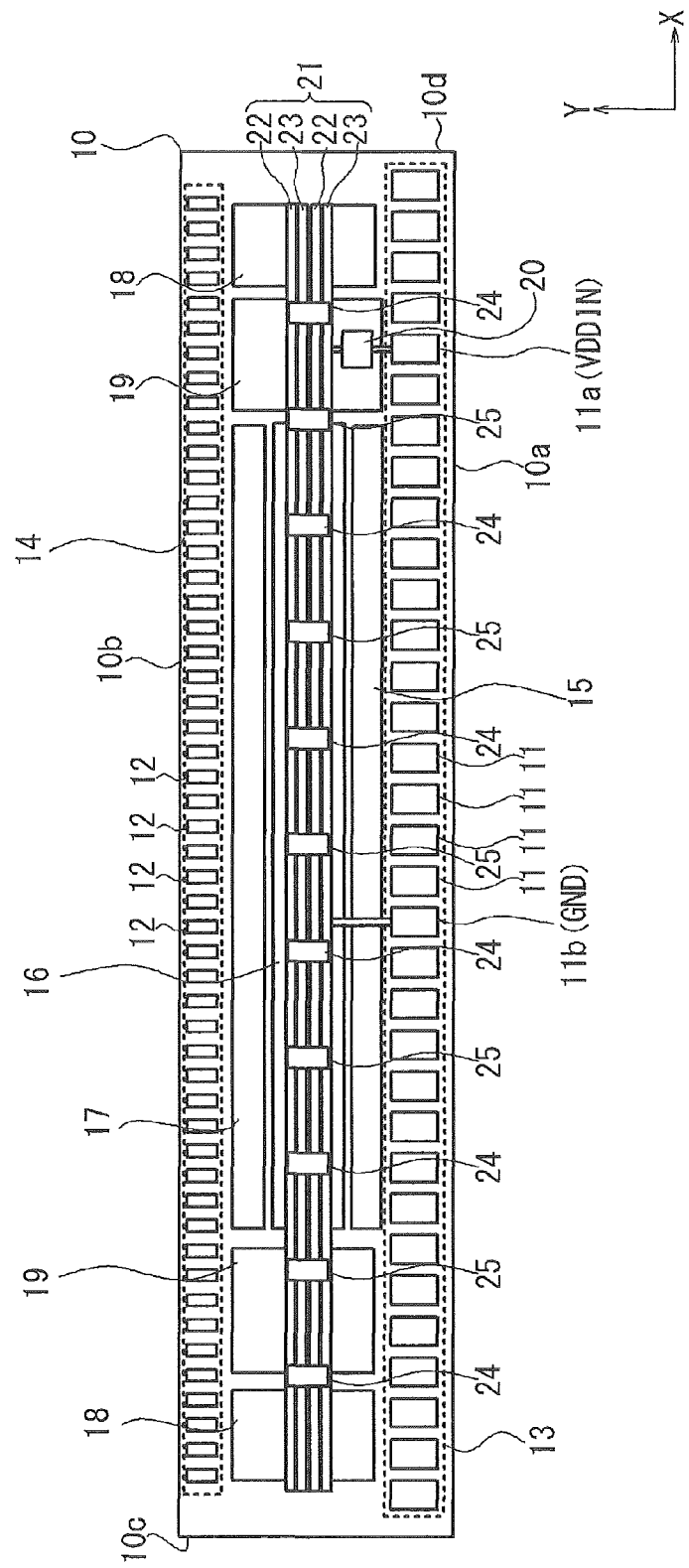
FIG. 1 is a plan view illustrating an exemplary structure of a semiconductor device in one embodiment of the present invention.

FIG. 1 is a plan view illustrating an exemplary structure of a semiconductor device in one embodiment of the present invention. The semiconductor device of the present embodiment, which is configured as a driver IC (integrated circuit) driving a LCD (liquid crystal display) panel, includes a semiconductor chip 10. The semiconductor chip 10 has a rectangular or substantially rectangular main face which has a pair of long sides 10a, 10b and short sides 10c and 10d. The long sides 10a and 10b are parallel to each other and the short sides 10c and 10d are parallel to each other. The long sides 10a and 10b are orthogonal to the short sides 10c and 10d. In the following description, an XY Cartesian coordinate system may be used in which the X-axis is defined as being parallel to the long sides 10a and 10b and the Y-axis is defined as being parallel to the short sides 10c and 10d. It should be noted that, although the main face of the semiconductor chip 10 is illustrated as rectangular in FIG. 1, the main face of the semiconductor chip 10 may be substantially rectangular, the corners of which are beveled.

The semiconductor chip 10 includes a plurality of bumps 11 and 12 on the main face. The bumps 11 are arrayed in an input-side bump placement region 13 positioned along the long side 10a and used as input terminals receiving signals from an external device (e.g. a central processing unit (CPU)). In the present embodiment, the bumps 11 include a power supply bump 11a which externally receives an external power supply voltage VDDIN and a grounded bump 11b which is used as a grounded terminal (a terminal kept at the circuit ground level GND). The bumps 12 are, on the other hand, arrayed in an output-side bump placement region 14 positioned along the long side 10b and used as output terminals externally outputting signals to an LCD panel (not shown). The bumps 11 and 12 may each include a film stack which includes an underbump metallization (UBM) layer and a conductive layer formed thereon, for example. The UBM layer may be formed of generally used material; for example, a film stack including a titanium tungsten (Ti—W) film and a gold (Au) film formed thereon may be used as the UBM layer. The conductive layer may be formed of low resistivity material; for example, a gold film formed through electroplating of gold may be used as the conductive layer. The bumps 11 and 12 have the same height and are formed of the same formation step at the same time.

Since an LCD panel usually includes many source lines and gate lines, the semiconductor chip 10, which operates as a driver IC driving an LCD panel, includes a large number of output terminals, that is, a large number of bumps 12. It should be therefore noted that the length of the long sides 10a and 10b is much larger than that of the short sides 10c and 10d in the present embodiment.

Various other circuits are integrated in the region between the input-side bump placement region 13 and the output-side bump placement region 14 of the semiconductor chip 10. In this embodiment, a liquid crystal drive circuit 15, a logic circuit 16, a source drive circuit 17, a gate drive circuit 18 and a peripheral circuit 19 are integrated in the semiconductor chip 10. The liquid crystal drive circuit 15 generates various analog signals used to drive the LCD panel. The logic circuit 16 performs various logic operations required for driving the LCD panel. The source drive circuit 17 drives the source lines (which are often referred to as data lines or signal lines, instead) of the LCD panel, and the gate drive circuit 18 drives the gate lines (which are often referred to as address lines or scan lines, instead) of the LCD panel. When a configuration in which a gate-in-panel (GIP) circuit driving the gate lines is integrated in the LCD panel is used, the gate drive circuit 18 may supply control signals to the GIP circuit. The peripheral circuit 19 generates various voltages and signals necessary for operating the liquid crystal drive circuit 15, the logic circuit 16, the source drive circuit 17 and the gate drive circuit 18. In the present embodiment, the peripheral circuit 19 includes a power supply circuit 20 which generates a power supply voltage VDD from the external power supply voltage VDDIN supplied to the power supply bump 11a.

A power line set 21 is disposed at the center portion of the semiconductor chip 10 (that is, in the region between the input-side bump placement region 13 and the output-side bump placement region 14). The power line set 21 includes a plurality of VDD power lines 22 and a plurality of GND power lines 23. The VDD power lines 22 are fed with the power supply voltage VDD from the power supply circuit 20. The GND power lines 23 are electrically connected to the grounded bump 11b and kept at the circuit ground level GND.

In the present invention, all of the VDD power lines 22 and the GND power lines 23 are disposed to extend in the direction parallel to the long sides 10a and 10b (that is, the X-axis direction). Since the semiconductor chip 10 in the present embodiment is structured so that the long sides 10a and 10b are much longer than the short sides 10c and 10d, the arrangement in which the VDD power lines 22 and the GND power lines 23 extend in the direction parallel to the long sides 10a and 10b is effective for efficiently supplying the power supply voltage VDD and the circuit ground level to respective circuits integrated in the semiconductor chip 10.

In detail, the VDD power lines 22 are used to supply the power supply voltage VDD, which is generated by the power supply circuit 20, to the liquid crystal drive circuit 15, the logic circuit 16, the source drive circuit 17, the gate drive circuit 18 and the peripheral circuit 19. In the structure illustrated in FIG. 1, two VDD power lines 22 are integrated in the semiconductor chip 10. Similarly, the GND power lines 23 are used to supply the circuit ground level to the liquid crystal drive circuit 15, the logic circuit 16, the source drive circuit 17, the gate drive circuit 18 and the peripheral circuit 19. In the structure illustrated in FIG. 1, two GND power lines 23 are integrated in the semiconductor chip 10. In the present embodiment, the VDD power lines 22 and the GND power lines 23 are alternately arrayed in the Y-axis direction.

Additionally, a plurality of bumps 24 and 25 are disposed at the center portion of the semiconductor chip 10. The bumps 24 and 25 are placed in the region between the input-side bump placement region 13 and the output-side bump placement region 14. The bumps 24 and 25 have the same height as that of the bumps 11 placed in the input-side bump placement region 13 and the bumps 12 placed in the output-side bump placement region 14. The bumps 24 and 25 are formed at the same formation step at the same time.

Figure 2:
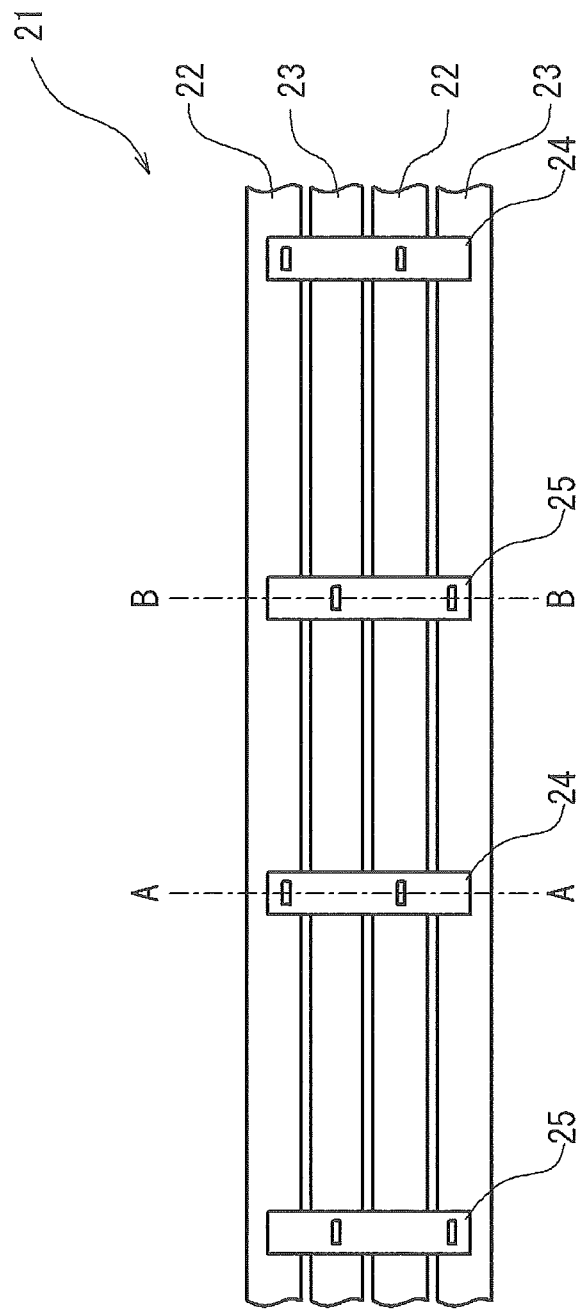
FIG. 2 is a plan view illustrating an exemplary arrangement of VDD power lines, GND power lines and bumps in the present embodiment.
Figure 3:
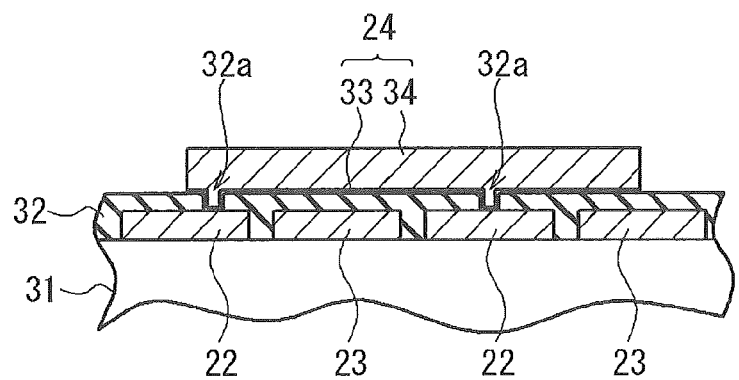
FIG. 3 is a section view illustrating an exemplary structure of the semiconductor device in the present embodiment on the A-A section indicated in FIG. 2.

FIG. 2 is a plan view illustrating the arrangement of the VDD power lines 22, the GND power lines 23 and the bumps 24 and 25. As illustrated in FIG. 2, the VDD power lines 22 are short-circuited each other by the bumps 24. In other words, the bumps 24 are each used as a shunt for short-circuiting the VDD power lines 22. FIG. 3 is a section view illustrating the structure of the semiconductor chip 10 in the present embodiment on the A-A section indicated in FIG. 2, especially the structure of the bumps 24.

As illustrated in FIG. 3, the VDD power lines 22 and the GND power lines 23 are all formed on an interlayer dielectric film 31. The interlayer dielectric film 31 may be formed of silicon oxide, for example. In the present embodiment, the VDD power lines 22 and the GND power lines 23 are located in the uppermost interconnection layer.

The VDD power lines 22 and the GND power lines 23 are covered with a surface protection layer (or passivation layer) 32. The surface protection layer 32 may be formed of silicon nitride, for example. Through holes 32a which reach the upper faces of the respective VDD power lines 22 are formed through the surface protection layer 32.

Each bump 24 is positioned at an upper position over the VDD power lines 22 and the GND power lines 23. Here, the term "at an (or the) upper position over" means being positioned apart from the semiconductor substrate (e.g. a silicon substrate) of the semiconductor chip 10 with respect to something. In detail, the bumps 24 are formed on the surface protection layer 32 in the present embodiment. Each bump 24 includes an UBM (underbump metallization) layer 33 formed on the upper face of the surface protection layer 32 and a conductive layer 34 formed of low resistivity material, such as gold (Au), on the upper face of the UBM layer 33. The UBM layer 33 may be formed of generally used material. For example, the UBM layer 33 may include a film stack which includes a titanium tungsten (Ti—W) film and a gold (Au) film formed thereon. The conductive layer 34 may be formed through electroplating of gold.

Each bump 24 is connected to the VDD power lines 22 in the through holes 32a. In detail, the UBM layer 33 of each bump 24 is formed to cover the side and bottom faces of the through holes 32a and the conductive layer 34 is formed to plug the through holes 32a. The bumps 24 thus structured each provide short-circuiting of the VDD power lines 22.

Figure 4:
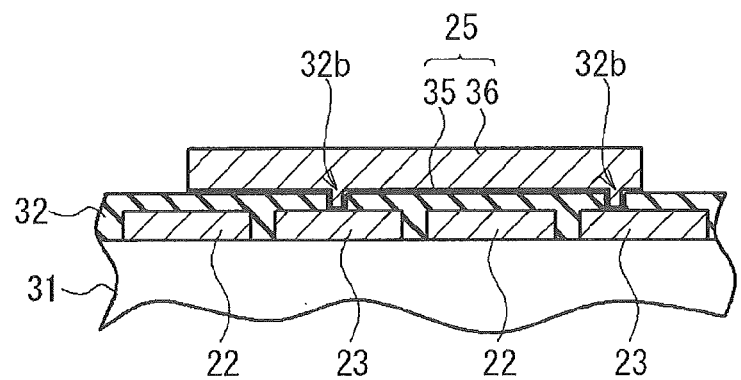
FIG. 4 is a section view illustrating an exemplary structure of the semiconductor device in the present embodiment on the B-B section indicated in FIG. 2.

Referring back to FIG. 2, the GND power lines 23 are short-circuited each other by the bumps 25. In other words, the bumps 25 are each used as a shunt for short-circuiting the GND power lines 23. FIG. 4 is a section view illustrating the structure of the semiconductor chip 10 in the present embodiment on the B-B section indicated in FIG. 2, especially the structure of the bumps 25.

As illustrated in FIG. 4, the bumps 25 are formed on the surface protection layer 32. In the present embodiment, each bump 25 includes an UBM layer 35 formed on the upper face of the surface protection layer 32 and a conductive layer 36 formed of low resistivity material, such as gold (Au), on the upper face of the UBM layer 35. The UBM layer 35 may be formed of generally known material. For example, the UBM layer 35 may include a film stack which includes a titanium tungsten (Ti—W) film and a gold (Au) film formed thereon. The conductive layer 36 may be formed through electroplating of gold.

Through holes 32b which reach the upper faces of the respective GND power lines 23 are formed through the surface protection layer 32, and the bumps 25 are each connected to the GND power lines 23 in the through holes 32b. In detail, the UBM layer 35 of each bump 25 is formed to cover the side and bottom faces of the through holes 32b and the conductive layer 36 is formed to plug the through holes 32b. The GND power lines 23 are short-circuited by the bumps 25 thus structured.

In the present embodiment, the bumps 24, which provide electrical connections between the VDD power lines 22, are each disposed to intersect the GND power lines 23 at an upper position over the GND power lines 23. Similarly, the bumps 25, which provide electrical connections between the GND power lines 23, are each disposed to intersect the VDD power lines 22 at an upper position over the VDD power lines 22. Such structure is related to the layout in which the VDD power lines 22 and the GND power lines 23 are alternately arrayed in the present embodiment. The layout in which the VDD power lines 22 and the GND power lines 23 are alternately arrayed effectively increases the capacitance between the VDD power lines 22 and the GND power lines 23 and thereby stabilizes the power supply voltage VDD on the VDD power lines 22. In order to provide electrical connections between the VDD power lines 22 in the layout in which the VDD power lines 22 and the GND power lines 23 are alternately arrayed, the bumps 24 are each disposed to intersect the GND power lines 23 at the upper position over the GND power lines 23. Similarly, in order to provide electrical connections between the GND power lines 23 in the layout in which the VDD power lines 22 and the GND power lines 23 are alternately arrayed, the bumps 25 are disposed to intersect the VDD power lines 22 at the upper position over the VDD power lines 22.

One of the advantages in the structure of the semiconductor chip 10 in the present invention is that the effective resistance of the power line set 21 is reduced due to the use of the bumps 24 and 25. More specifically, in the semiconductor chip 10 in the present embodiment, the overall resistance of the VDD power lines 22 is reduced by short-circuiting the VDD power lines 22 with the bumps 24. This effectively improves the noise tolerance of the semiconductor chip 10. Differently from metal interconnections integrated inside the semiconductor chip 10 (that is, metal interconnections integrated below the surface protection layer 32), the bumps 24 can be formed of low resistance material (such as gold) and the thickness of the bumps 24 can be easily increased. This implies that the resistance of the bumps 24 can be reduced. Accordingly, the overall resistance of the VDD power lines 22 can be further reduced by short-circuiting the VDD power lines 22 by using the bumps 24, compared with the case when the VDD power lines 22 are short-circuited by using metal interconnections integrated inside the semiconductor chip 10.

It should be noted here that, in the structure in which the bumps 24 are used as shunts which provide short-circuiting between the VDD power lines 22, it is important that the VDD power lines 22 are short-circuited at multiple locations, that is, multiple bumps 24 are used to provide the short-circuiting of the VDD power lines 22. If the VDD power lines 22 are short-circuit at a single location, this may cause an unevenness of the power supply voltage VDD depending on the location, due to the voltage drop across the VDD power lines 22.

Similarly, the use of the bumps 25 effectively reduces the overall resistance of the GND power lines 23, improving the noise tolerance. It should be noted here that, in the structure in which the bumps 25 are used as shunts which provide short-circuiting between the GND power lines 23, it is important that the GND power lines 23 are short-circuited at multiple locations, that is, multiple bumps 25 are used to provide the short-circuiting of the GND power lines 23, as is the case with the bumps 24.

The above-described semiconductor chip 10 in the present embodiment is suitable for being mounted on a display panel module by using COG mounting. As discussed later in detail, the bumps 24 and 25 disposed at the center portion of the semiconductor chip 10 effectively suppresses deformation of the semiconductor chip 10 in the COG mounting process, especially in the case when the thickness of the semiconductor chip 10 is reduced and the length of the short sides 10c and 10d is increased. In the following, a detailed description is given of a display device module in which the semiconductor chip 10 is mounted on an LCD panel by COG mounting and the process of the COG mounting.

Figure 5:
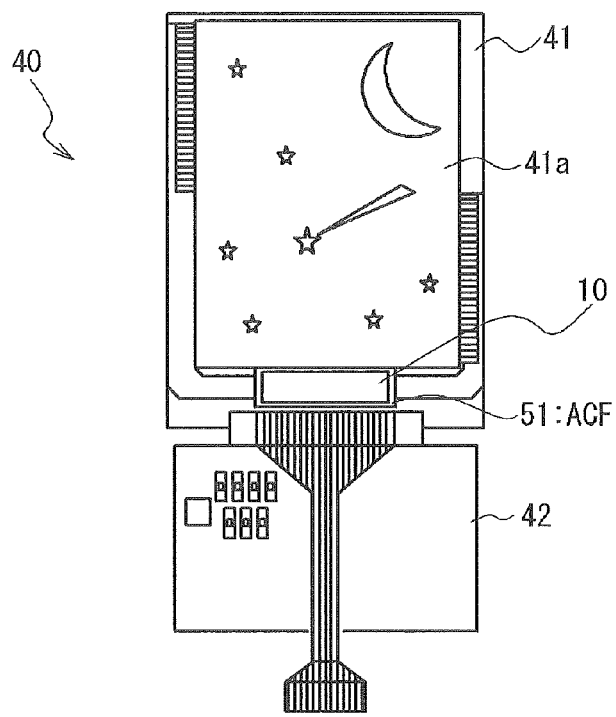
FIG. 5 is a plan view illustrating an exemplary structure of a display device module in the present embodiment.

FIG. 5 is a plan view illustrating an exemplary structure of a display device module 40 in the present embodiment. As illustrated in FIG. 5, the display device module 40 includes an LCD panel 41 and an FPC (flexible printed circuit board) 42. The semiconductor chip 10, which functions as a driver IC which drives the LCD panel 41, is mounted on the LCD panel 41 by COG mounting. The LCD panel 41 is driven by the semiconductor chip 10 to display a desired image on the display section 41a of the LCD panel 41.

Figure 6:
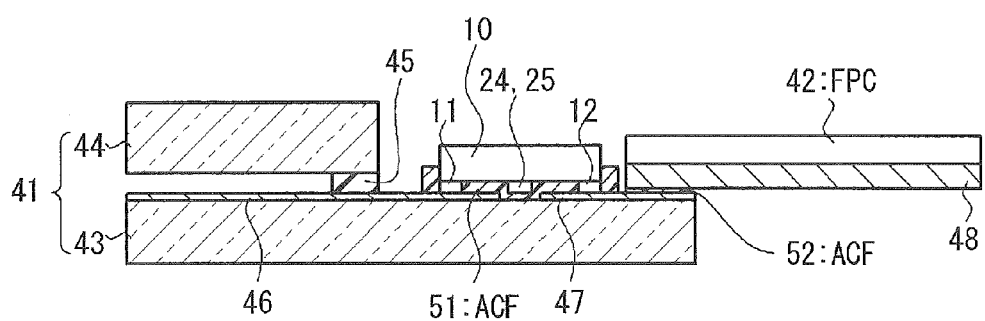
FIG. 6 is a section view partially illustrating the structure of the display device module in the present embodiment.

FIG. 6 is a section view partially illustrating the structure of the display device module 40. As illustrated in FIG. 6, the LCD panel 41 includes glass substrates 43 and 44. The glass substrates 43 and 44 are held by a spacer 45, opposed to each other across a small gap interposed therebetween. Formed on the surface of the glass substrate 43 are interconnections 46 (one shown) and interconnections 47 (one shown). The interconnections 46 are electrically connected to the bumps 11 (which function as output terminals) of the semiconductor chip 10 and the interconnections 47 are electrically connected to the bumps 12 (which function as input terminals).

The semiconductor chip 10 is mounted on the glass substrate 43 by COG mounting which uses anisotropic conductive material. The anisotropic conductive material mainly consists of conductive particles and adhesive (binder) in which the conductive particles are dispersed. When a pressure is applied to a film of anisotropic conductive material in the film thickness direction with the film heated, the film is placed into a state in which the film is conductive in the film thickness direction and insulative in the in-plane direction. Here, the term "mainly" means that minor material(s) may be added. In the present embodiment, an ACF (anisotropic conductive film) 51 is used as anisotropic conductive material and the semiconductor chip 10 is bonded to the glass substrate 43 with the ACF 51. Here, the bumps 11 of the semiconductor chip 10 are electrically connected to the interconnections 46 via conductive particles included in the ACF 51. Similarly, the bumps 12 are electrically connected to the interconnections 47 via conductive particles included in the ACF 51.

The FPC 42 is bonded to the glass substrate 43 with an ACF 52. Interconnections 48 (one shown) formed on the surface of the FPC 42 are electrically connected to the interconnections 47 via conductive particles included in the ACF 52. The interconnections 48 are electrically connected to the bumps 12 of the semiconductor chip 10 via the ACF 52, the interconnections 47 and the ACF 51. This implies it is possible to feed signals to the bumps 12 of the semiconductor chip 10 from the interconnections 48.

Figure 7:
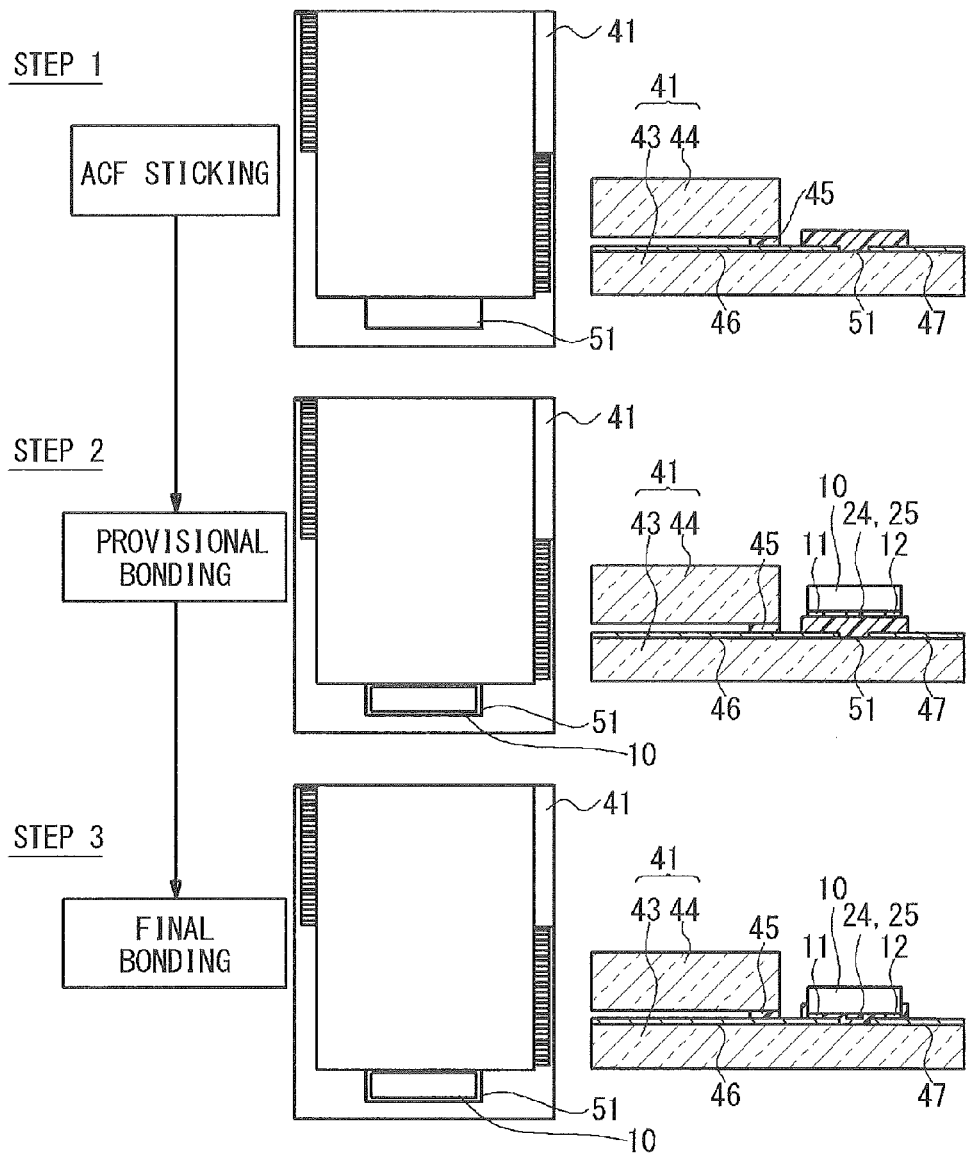
FIG. 7 is a diagram illustrating a manufacturing method of the display device module in the present embodiment.

FIG. 7 illustrates an exemplary manufacturing method of the display device module 40 in the present embodiment, more specifically, a series of steps performed for mounting the semiconductor chip 10 onto the glass substrate 43 of the LCD panel 41.

The process for mounting the semiconductor chip 10 onto the LCD panel 41 begins with sticking the ACF 51 onto the glass substrate 43 (step 1). The ACF 51 is stuck at the position at which the semiconductor chip 10 is to be bonded to the glass substrate 43.

This is followed by provisional bonding of the semiconductor chip 10 to the ACF 51 in a state in which the semiconductor chip 10 is positioned at a desired position of the glass substrate 43 (step 2). In this step, the semiconductor chip 10 is pressed against the ACF 51 with a relatively small pressure; electrical connections are not established between the bumps 11 of the semiconductor chip 10 and the interconnections 46 on the glass substrate 43 and between the bumps 12 and the interconnections 47.

This is followed by final bonding (step 3). In detail, the semiconductor chip 10 is pressed against the glass substrate 43 with a relatively large pressure with the glass substrate 43 being heated, and thereby the semiconductor chip 10 is bonded to the glass substrate 43 with the ACF 51. As a result, the bumps 11 of the semiconductor chip 10 are electrically connected to the interconnections 46 via the conductive particles included in the ACF 51 and the bumps 12 are electrically connected to the interconnections 47 in the same manner.

It should be noted that a deformation of the semiconductor chip 10 in the final bonding (at step 3) may become a problem when the semiconductor chip 10 has an extremely reduced thickness and an increased length in the direction along the short sides 10c and 10d. In the case that the semiconductor chip 10 is mainly formed of a silicon substrate, a deformation of the semiconductor chip 10 may become a problem, for example, when the thickness of the semiconductor chip 10 is equal to or less than 200 μm and the length of the short sides 10c and 10d is equal to or more than 1 mm. In the present embodiment, however, the bumps 24 and 25, which are disposed at the center portion of the semiconductor chip 10, effectively suppress the deformation of the semiconductor chip 10 in the final bonding.

Let us consider the case, for example, that the semiconductor chip include only bumps 11 and 12 disposed along the long sides 10a and 10b of the semiconductor chip and no bumps are disposed at the center portion as illustrated in FIG. 8; the semiconductor chip thus structured is denoted by numeral 100 in FIG. 8. When a large pressure is applied to the rear face (the face on which the bumps 11 and 12 are not disposed) of the semiconductor chip 100 in the final bonding, the center portion of the semiconductor chip 100 is pressed and this may cause a deformation of the semiconductor chip 100.

In the semiconductor device in the present embodiment, in contrast, the deformation at the center portion of the semiconductor chip 10 is effectively suppressed as illustrated in FIG. 9, even when a pressure is applied to the rear face of the semiconductor chip 10 in the final bonding, since the pressure is distributed due to the bumps 24 and 25 disposed at the center portion. More specifically, when a pressure is applied to the rear face of the semiconductor chip 10, the bumps 24 and 25 are pushed against the glass substrate 43 of the LCD panel 41, functioning as posts which support the center portion of the semiconductor chip 10. As a result, the bumps 24 and 25 distribute the pressure applied to the rear face, suppressing the deformation of the semiconductor chip 10 at the center portion.

As thus described, in the semiconductor device in the present embodiment, the multiple bumps 24 and 25 are placed at the center portion of the semiconductor chip 10 (more specifically, in the region between the input-side bump placement region 13 and the output-side bump placement region 14). The VDD power lines 22 of the power line set 21 are short-circuited by the multiple bumps 24 and the GND power lines 23 are short-circuited by the multiple bumps 25. Such structure effectively reduces the overall resistances of the VDD power lines 22 and the GND power lines 23, improving the noise tolerance.

Also, the structure of the semiconductor device in the present embodiment, in which the bumps 24 and 25 are disposed at the center portion of the semiconductor chip 10, effectively suppresses the deformation of the semiconductor chip 10 in the process of COG mounting.

Although preferred embodiments of the present invention are specifically described in the above, the present invention should not be construed as being limited to the above-described embodiments; it would be apparent to a person skilled in the art that the present embodiment may be implemented with various modifications.

For example, the arrangement of the power line set 21 and the bumps 24 and 25 may be variously modified in the present embodiment. FIGS. 10 and 11 are plan view illustrating modifications of the semiconductor device according to the present invention. As illustrated in FIG. 10, for example, a plurality of power line sets 21 are disposed and a plurality of bumps 24 and a plurality of bumps 25 are disposed for each power line set 21. FIG. 10 illustrates the structure in which two power line sets, denoted by numeral 21A and 21B, are disposed. The power line sets 21A and 21B are arrayed in the Y-axis direction (the direction parallel to the short sides 10c and 10d of the semiconductor chip 10), and each of the power line sets 21A and 21B includes a plurality of VDD power lines 22 and a plurality of GND power lines 23. In each of the power line sets 21A and 21B, the VDD power lines 22 are short-circuited by the multiple bumps 24 and the GND power lines 23 are short-circuited by the multiple bumps 25.

As illustrated in FIG. 11, the positions of the bumps 24 and 25 across the power line set 21A may be shifted in the X-axis direction (the direction parallel to the long sides 10a and 10b of the semiconductor chip 10) with respect to the positions of the bumps 24 and 25 across the power line set 21B. Such arrangement of the bumps 24 and 25 is preferable for distributing the pressure applied to the rear face of the semiconductor chip 10 and thereby further suppressing the deformation of the semiconductor chip 10.

Although each bump 24 is disposed to short-circuit two VDD power lines 22 in the above-described embodiments, the power line set 21 (or each of the power line sets 21A and 21B) may include three or more VDD power lines 22, each bump 24 being disposed to short-circuit the three or more VDD power lines 22. Similarly, the power line set 21 (or each of the power line sets 21A and 21B) may include three or more GND power lines 23, each bump 25 being disposed to short-circuit the three or more GND power lines 23.

Although each bump 24 is illustrated as being directly connected to the VDD power lines 22 in the above-described embodiment, each bump 24 may be electrically connected to the VDD power lines 22 via another interconnection layer (which may include a pad). Similarly, each bump 25 may be electrically connected to the GND power lines 23 via another interconnection layer (which may include a pad).

Also, although embodiments of a driver IC which drives an LCD panel are described in the above, the present invention may be applied to a driver IC which drives a display panel other than an LCD panel (for example, an organic light emitting display (OLED) panel). Furthermore, the semiconductor device according to the present invention may be implemented as various devices other than a driver IC which drives a display panel.

What is claimed is:

1. A semiconductor device, comprising:
    a semiconductor chip comprising a main face which includes a pair of long sides parallel to each other and a pair of short sides orthogonal to said pair of long sides;
    a plurality of first bumps arrayed in a first bump placement region of said semiconductor chip, said first bump placement region being positioned along one of said pair of long sides;
    a plurality of second bumps arrayed in a second bump placement region of said semiconductor chip, said second bump placement region being positioned along an other of said pair of long sides;
    a plurality of first power lines disposed in a region between said first bump placement region and said second bump placement region, said plurality of first power lines extending, in a direction parallel to said pair of long sides, between opposing edges of the first bumps and the second bumps; and
    a plurality of third bumps, located between the first bumps and the second bumps, integrated on said semiconductor chip, and arrayed in a third bump placement region of said semiconductor chip, the third bump placement region being different from said first bump placement region and said second bump placement region,
    wherein each of said plurality of third bumps provides short-circuiting of said plurality of first power lines.

2. The semiconductor device according to claim 1, further comprising:
    a plurality of second power lines disposed in the region between said first bump placement region and said second bump placement region, said plurality of second power lines extending in the direction parallel to said pair of long sides; and
    a plurality of fourth bumps integrated on said semiconductor chip,
    wherein said plurality of first power lines are fed with a power supply voltage,
    wherein said plurality of second power lines has a circuit ground level, and
    wherein each of said plurality of fourth bumps provides short-circuiting of said plurality of second power lines.

3. The semiconductor device according to claim 2, wherein said plurality of first power lines and said plurality of second power lines are alternately arrayed in a direction parallel to said pair of short sides.

4. The semiconductor device according to claim 3, wherein each of said plurality of third bumps is positioned at an upper position over said second power lines, and
    wherein each of said plurality of fourth bumps is positioned at an upper position over said first power lines.

5. The semiconductor device according to claim 2, wherein said first, second, third, and fourth bumps have a same height.

6. The semiconductor device according to claim 1, wherein the opposing edges of the first bumps and the second bumps face each other such that an edge of the plurality of first power lines faces the edges of the first bumps, and another edge of the plurality of first power lines faces the edges of the second bumps.

7. The semiconductor device according to claim 1, wherein the opposing edges of the first bumps and the second bumps face each other such that, in a direction parallel to said pair of short sides, an edge of the plurality of first power lines faces the edges of the first bumps, and another edge of the plurality of first power lines faces the edges of the second bumps.

8. The semiconductor device according to claim 1, wherein, in a plan view of the semiconductor device, the first power lines extend outside the first bumps and the second bumps.

9. The semiconductor device according to claim 1, wherein, in a plan view of the semiconductor device, an entirety of the first power lines extends outside the first bumps and the second bumps.

10. The semiconductor device according to claim 1, wherein, in a plan view of the semiconductor device, the first power lines overlap with the third bumps.

11. The semiconductor device according to claim 1, further comprising:
    a plurality of second power lines disposed in the region between said first bump placement region and said second bump placement region, said plurality of second power lines extending, in the direction parallel to said pair of long sides, between the opposing edges of the first bumps and the second bumps.

12. The semiconductor device according to claim 11, further comprising:
    a plurality of fourth bumps integrated on said semiconductor chip,
    wherein each of said plurality of fourth bumps provides short-circuiting of said plurality of second power lines and extends between the opposing edges of the first bumps and the second bumps.

13. The semiconductor device according to claim 12, wherein the plurality of third bumps and said plurality of fourth bumps are alternately arrayed in the direction parallel to said pair of long sides.

14. The semiconductor device according to claim 12, wherein, in a plan view of the semiconductor device, an entirety of the first power lines, the second power lines, the third bumps, and the fourth bumps extends outside the first bumps and the second bumps.

15. A display device module, comprising:
a display panel; and
a semiconductor device bonded on a glass substrate of said display panel,
wherein said semiconductor device includes:
   a semiconductor chip comprising a main face which includes a pair of long sides parallel to each other and a pair of short sides orthogonal to said pair of long sides;
   a plurality of first bumps arrayed in a first bump placement region of said semiconductor chip, said first bump placement region being positioned along one of said pair of long sides;
   a plurality of second bumps arrayed in a second bump placement region of said semiconductor chip, said second bump placement region being positioned along an other of said pair of long sides;
   a plurality of first power lines disposed in a region between said first bump placement region and said second bump placement region to extend, in a direction parallel to said pair of long sides, between opposing edges of the first bumps and the second bumps; and
   a plurality of third bumps, located between the first bumps and the second bumps, integrated on said semiconductor chip, and arrayed in a third bump placement region of said semiconductor chip, the third bump placement region being different from said first bump placement region and said second bump placement region,
wherein said semiconductor chip is bonded to said glass substrate so that said plurality of first bumps, said plurality of second bumps and said plurality of third bumps are opposed to said glass substrate,
wherein said plurality of first bumps are connected to first interconnections formed on said glass substrate,
wherein said plurality of second bumps are connected to second interconnections formed on said glass substrate, and
wherein each of said plurality of third bumps provides short-circuiting of said plurality of first power lines.

16. The display device module according to claim 15, wherein said semiconductor chip is bonded to said glass substrate by an anisotropic conductive material mainly consisting of conductive particles and an adhesive in which said conductive particles are dispersed.

17. The display device module according to claim 16, wherein a thickness of said semiconductor chip is equal to or less than 200 μm, and
wherein a length of said pair of short sides is equal to or more than 1 mm.

18. A method of manufacturing a display device module, said method comprising:
bonding a semiconductor device to a glass substrate of a display panel,
wherein said semiconductor device includes:
   a semiconductor chip comprising a main face including a pair of long sides parallel to each other and a pair of short sides orthogonal to said pair of long sides;
   a plurality of first bumps arrayed in a first bump placement region of said semiconductor chip, said first bump placement region being positioned along one of said pair of long sides;
   a plurality of second bumps arrayed in a second bump placement region of said semiconductor chip, said second bump placement region being positioned along an other of said pair of long sides;
   a plurality of first power lines disposed in a region between said first bump placement region and said second bump placement region to extend, in a direction parallel to said pair of long sides, between opposing edges of the first bumps and the second bumps; and
   a plurality of third bumps, located between the first bumps and the second bumps, integrated on said semiconductor chip, and arrayed in a third bump placement region of said semiconductor chip, the third bump placement region being different from said first bump placement region and said second bump placement region,
wherein each of said plurality of third bumps provides short-circuiting of said plurality of first power lines,
wherein said semiconductor chip is bonded to said glass substrate so that said plurality of first bumps, said plurality of second bumps and said plurality of third bumps are opposed to said glass substrate, and
wherein, in said bonding, said plurality of first bumps are connected to first interconnections formed on said glass substrate, and said plurality of second bumps are connected to second interconnections formed on said glass substrate.

19. The method according to claim 18, wherein, in said bonding, said semiconductor chip is bonded to said glass substrate by an anisotropic conductive material mainly consisting of conductive particles and an adhesive in which said conductive particles are dispersed.

20. The method according to claim 19, wherein a thickness of said semiconductor chip is equal to or less than 200 μm, and
wherein a length of said pair of short sides is equal to or more than 1 mm.

* * * * *